United States Patent
Buchanan et al.

(10) Patent No.: US 10,706,922 B2
(45) Date of Patent: Jul. 7, 2020

(54) MEMRISTIVE ARRAYS WITH OFFSET ELEMENTS

(71) Applicant: Hewlett Packard Enterprise Development LP, Houston, TX (US)

(72) Inventors: Brent Buchanan, Fort Collins, CO (US); Le Zheng, Palo Alto, CA (US); John Paul Strachan, San Carlos, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 16 days.

(21) Appl. No.: 16/063,804

(22) PCT Filed: Jan. 26, 2016

(86) PCT No.: PCT/US2016/014887
§ 371 (c)(1),
(2) Date: Jun. 19, 2018

(87) PCT Pub. No.: WO2017/131632
PCT Pub. Date: Aug. 3, 2017

(65) Prior Publication Data
US 2019/0237137 A1 Aug. 1, 2019

(51) Int. Cl.
*G11C 13/00* (2006.01)
*G06G 7/16* (2006.01)
(Continued)

(52) U.S. Cl.
CPC .......... *G11C 13/0026* (2013.01); *G06F 17/16* (2013.01); *G06G 7/16* (2013.01);
(Continued)

(58) Field of Classification Search
None
See application file for complete search history.

(56) References Cited

U.S. PATENT DOCUMENTS

| 5,014,235 A | 5/1991 | Morton |
| 6,269,352 B1 | 7/2001 | Fabbrizio et al. |

(Continued)

OTHER PUBLICATIONS

Gao L. et al., "Analog-Input Analog-Weight Dot-Product Operation With Ag/a-Si/Pt Memristive Devices", < https://www.ece.ucsb.edu/~strukov/papers/2012/VLSISOCdp2012.pdf > (Research Paper), Jul. 17, 2012, 6 pages.
(Continued)

*Primary Examiner* — Michael D. Yaary
(74) *Attorney, Agent, or Firm* — Park, Vaughan, Fleming & Dowler LLP

(57) ABSTRACT

In one example in accordance with the present disclosure a device is described. The device includes a cross-bar array of memristive elements. Each memristive element has a conductance value. The device also includes a column of offset elements. An offset element is coupled to a row of memristive elements and has a conductance value. The device also includes a number of accumulation elements. An accumulation element is coupled to a column of memristive elements. The accumulation element collects an intermediate output from the column and subtracts from the intermediate output an output from the column of offset elements.

20 Claims, 6 Drawing Sheets

(51) Int. Cl.
*G11C 11/16* (2006.01)
*G06F 17/16* (2006.01)

(52) U.S. Cl.
CPC ...... *G11C 11/1659* (2013.01); *G11C 13/0007* (2013.01); *G11C 13/0023* (2013.01); *G11C 13/0028* (2013.01); *G11C 13/004* (2013.01); *G11C 2013/0057* (2013.01); *G11C 2213/32* (2013.01); *G11C 2213/77* (2013.01)

(56) References Cited

U.S. PATENT DOCUMENTS

| | | | |
|---|---|---|---|
| 7,711,765 B2 | 5/2010 | Wang et al. | |
| 9,947,405 B2 * | 4/2018 | Strachan | G11C 13/0069 |
| 10,008,264 B2 * | 6/2018 | Ge | G11C 7/1006 |
| 10,109,348 B2 * | 10/2018 | Hu | G11C 13/0026 |
| 2004/0251988 A1 | 12/2004 | Sharma et al. | |
| 2013/0028004 A1 | 1/2013 | Snider | |
| 2014/0028347 A1 | 1/2014 | Robinett et al. | |
| 2014/0172937 A1 | 6/2014 | Linderman et al. | |
| 2014/0361851 A1 | 12/2014 | Keane et al. | |
| 2017/0011290 A1 * | 1/2017 | Taha | G06N 3/0635 |

OTHER PUBLICATIONS

International Searching Authority, The International Search Report and the Written Opinion, PCT/US2016/014887, dated Sep. 12, 2016, 12 Pgs.

Soudry D. et al., "Memristor-Based Multilayer Neural Networks With Online Gradient Descent Training", < http://webee.technion. ac.il/people/skva/TNNLS.pdf > (Research Paper), Dec. 11, 2014, 14 pages.

* cited by examiner

MEMRISTIVE ARRAYS WITH OFFSET ELEMENTS

BACKGROUND

Resistive memory elements, such as memristors are devices that may be programmed to different states by applying electrical voltages or currents to the memristors. After programming, the state of the memristors may be read. The state of the memristors remains stable long enough to regard the device as non-volatile. A number of memristors may be included within a crossbar array in which a number of column lines intersect with a number of row lines, the memristors being located at the intersection of a column line and a row line.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
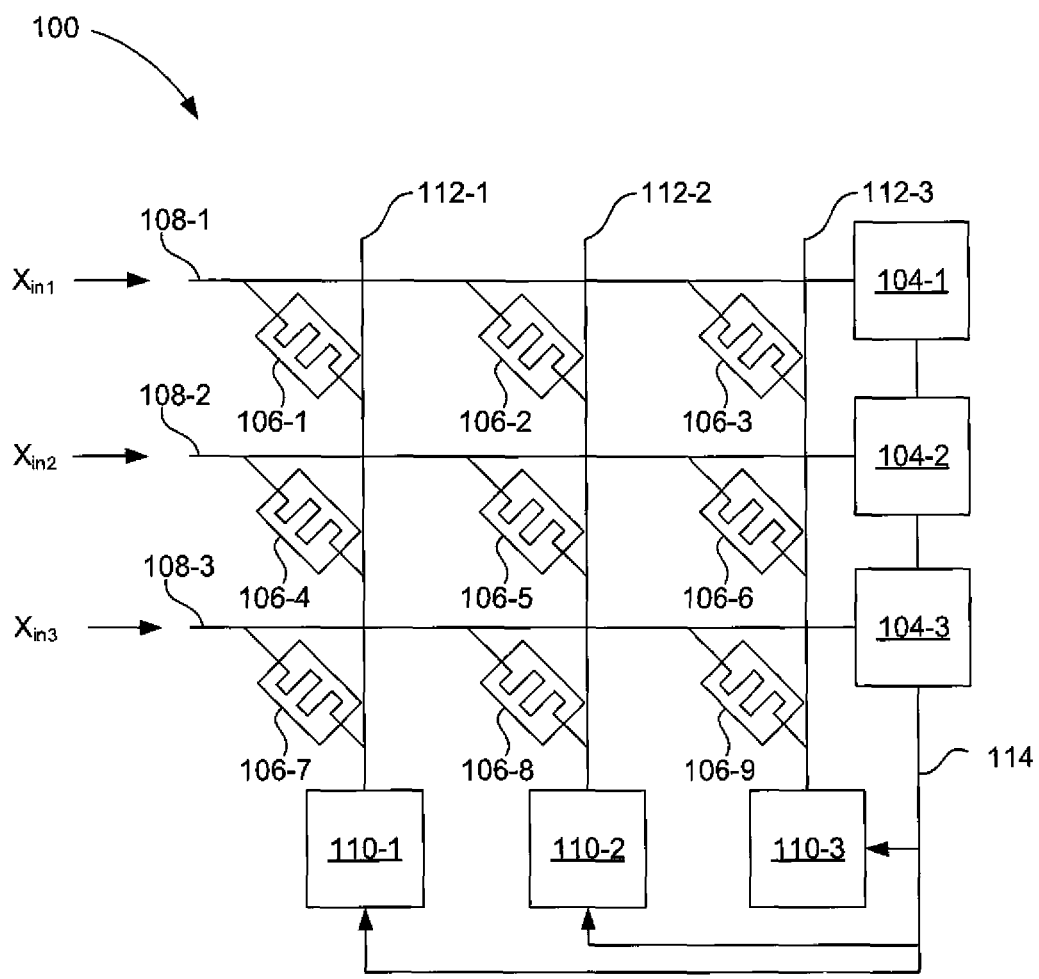
FIG. 1 is a diagram of a memristive array with offset elements for performing a multiply-accumulate (MAC) operation, according to one example of the principles described herein.

Crossbar arrays of memristive elements such as memristors may be used in a variety of applications, including non-volatile solid state memory, programmable logic, signal processing, control systems, pattern recognition, and other applications. The present application is directed to a memristive array used to perform a multiply-accumulate (MAC) operation of, for example, a matrix of weight values and a number of input vector values. In other words, a memristive array can be used to perform vector-matrix or multiply-accumulate computations. The memristive crossbar array includes a number of row lines, a number of column lines intersecting the row lines to form a number of junctions, and a number of resistive memory elements coupled between the row lines and the column lines at the junctions. An input voltage signal along each row of an array is weighted by the conductance of the memristive elements, and accumulated as the current output from each column. Throughout the specification, a first set of interconnect lines may be referred to as row lines and a second set of interconnect lines may be referred to as column lines. However the terms row and column are merely used to simplify the description and the first set of interconnect lines and second set of interconnect lines may be oriented in other fashions than rows or columns.

MAC operations are used in a number of applications. For example, given a received audio signal or a received video signal, a user may desire to filter, perform a Fast Fourier Transformation of the signal, or otherwise process an analog or digital signal. In these examples, a MAC operation is used for performing such processing. Given the wide use of MAC operations in discrete-time or discrete-space signal processing, the optimization of such a process is desirable to increase the efficiency of discrete-time or discrete-space signal processing. In some examples, conductances of memristive elements in an array may be used as the matrix weight values that an input signal is to be multiplied by in a MAC operation. While the use of such arrays is indeed helpful in carrying out MAC operations that are used in many applications, some characteristics of the array limit their full use.

For example, in performing signal filtering, or other applications for which a MAC operation is desired, negative weight values may be present in the matrix that is used in the MAC operation. Such positive and negative weights represent constructive and destructive interference patterns, respectively, that are at the heart of filtering operations. However, as memristors have positive conductance, there is difficulty in representing these negative weight values with memristive elements that have a positive conductance.

Accordingly, the present specification describes a device for performing a MAC operation. The device includes a crossbar array of memristive elements having conductance values. The memristive elements receive an input vector signal. The device also includes offset elements with conductances that compute an input-dependent sum. The outputs from columns of memristive elements are collected and the outputs equals the dot product of the matrix values with the vector values.

More specifically, the present specification describes an array for performing a MAC operation. The array includes a number of memristive elements having a conductance value. The array also includes a column of offset elements. An offset element is coupled to a row of memristive elements and has a conductance value. The device also includes a number of accumulation elements. Each accumulation element is coupled to a column of memristive elements and the column of offset elements and 1) collects an intermediate output from the column of memristive elements and 2) subtracts from the intermediate output an output from the column of offset elements.

The present specification also describes a method for performing a MAC operation. According to the method, voltages are applied to a number of row lines. A voltage defines a sample value of an input vector and a row line includes a number of memristive elements, which represent offset weight values of a matrix, and an offset element. For each column of memristive elements, an intermediate output is collected. The intermediate output defines a dot product of the input vector and an offset weight vector of an offset weight matrix. Offset weight values of the offset weight vector are equivalent to the summation of a non-offset weight value, which can be negative, and an offset to produce a positive-valued offset weight value. For a column of offset elements, an offset output is collected that defines a dot product of the input vector and an offset vector. The offset output is subtracted from each intermediate output to generate a column output. The column output defines a dot product of the input vector and a weight vector.

The present specification also describes an array that includes a number of row lines to pass voltages defining sample values of an input vector to rows of memristive elements. The array also includes a number of column lines intersecting the row lines to form a number of junctions. A number of memristive elements are coupled between the row lines and the column lines at the junctions. Each memristive element has a conductance value. The array includes an offset element column wherein an individual offset element is coupled to a row of memristive elements. The array further comprises an offset collection line to collect an offset output of the offset element column. The offset output defines a dot product of offset values and the input vector. A number of memristive collection lines collect an intermediate output of corresponding columns of memristive elements. The intermediate output defines a dot product of the input vector and an offset weight vector. The offset weight element values are equivalent to the summation of the conductance of a non-offset weight value, which may be negative, and the conductance value of the offset element value. An accumulation element of the array subtracts the offset column output from each intermediate output to generate a column output. The column output defines a dot product of the input vector signal and the non-offset weight vector.

Using offset elements to shift weight values of an original, not-offset, matrix to the positive domain allows a single array of memristive elements to represent an original matrix that has both negative weight values and positive weight values. In other words, where before multiple fully-duplicated arrays were used to represent positive and negative weight values in a matrix; using an offset, each weight value in a matrix can be shifted such that in an offset matrix there are no negative weights. Accordingly, each weight value in the offset matrix can be represented by a positive conductance of a memristive element. However, it is contemplated that the devices disclosed herein may provide useful in addressing other matters and deficiencies in a number of technical areas. Therefore the systems and methods disclosed herein should not be construed as addressing any of the particular matters.

As used in the present specification and in the appended claims, the term "memristive element" may refer to a passive two-terminal circuit element that maintains a functional relationship between the time integral of current, and/or the time integral of voltage.

Still further, as used in the present specification and in the appended claims, the term "multiply-accumulate operation" is meant to be understood broadly as the product of two vectors to form a scalar, whose value is the product of the magnitudes of the vectors and the cosine of the angle between them and the summation of those products. In one example, the vectors may be represented as matrices that may be multiplied. Other names for a multiply-accumulate operation include dot product, scalar product, and inner product. A MAC calculation is a computationally expensive task for a digital computer. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense.

Still further, as used in the present specification and in the appended claims, the term "weight" may refer to the matrix of coefficients used in performing a dot product. Accordingly, a weight value refers to an individual coefficient within the matrix. Each coefficient of the weight may be indicated by a particular memristive element in an array.

Still further, as used in the present specification and in the appended claims, the term "original matrix" or "original weight vector" refer to a matrix or weight vector that has not been shifted, or not offset, into an entirely positive domain. By comparison, an "offset matrix" or "offset weight vector" is a matrix or weight vector that has been shifted on account of the offset elements such that the offset weight values of the offset matrix are entirely in the positive domain.

Still further, in the present application for simplicity row lines and column lines are used to refer to groupings of memristive elements. However, the row lines and the column lines are used for reference, and the memristive elements may be organized in orientations other than rows and columns.

Even further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language indicates that a particular feature, structure, or characteristic described in connection with that example is included as described, but may not be included in other examples.

Turning now to the figures, FIG. 1 is a diagram of a memristive array (100) with offset elements (104) for performing a MAC operation, according to one example of the principles described herein. The memristive array (100) may be implemented in an electronic device. Examples of electronic devices include servers, desktop computers, laptop computers, personal digital assistants (PDAs), mobile devices, smartphones, gaming systems, and tablets, among other electronic devices. The memristive array (100) may be utilized in any data processing scenario including, stand-alone hardware, mobile applications, through a computing network, or combinations thereof. Further, the memristive array (100) may be used in a computing network, a public cloud network, a private cloud network, a hybrid cloud network, other forms of networks, or combinations thereof.

The array (100) includes a number of memristive elements (106). Each memristive element (106) has a conductance value. As used in the present specification, the indicator "-*" refers to a specific instance of an element. For example, a first memristive element is referenced as (106-1). The absence of the indicator "-*" refers to the element in general. For example, a generic memristive element is referenced as (106).

A memristive element (106) stores information based on a conductance level of the memristive element (106), each level corresponding to a state of the memristive element (106). By switching between conductance states, the memristive element (106) therefore represent multiple logic values and store multiple bits of information.

Put another way, the memristive element (106) can be used to represent a number of bits of data. For example, a memristive element (106) in a first conductance state may represent a logic value of "0." The same memristive element (106) in a second-conductance state may represent a logic value of "1." Each logic value is associated with a conductance state of the memristive element (106) such that data can be stored in a memristive element (106) by changing the conductance state of the memristive element (106). This may be done by applying a voltage potential across a target memristive element (106) by passing voltages to interconnect lines that correspond to the target memristive element (106). While specific mention is made of memristive elements (106) representing two logic values, i.e., a binary memristive element (106), a memristive element (106) can have any number of conductance states and therefore can represent any number of logic values. For example a memristive element (106) can have three, four, or even more conductance states.

A memristive element (106) may change conductances by transporting dopants within a switching layer to increase or decrease the conductance of the memristive element (106). As a sufficient voltage is passed across the memristive element (106) the dopants become active such that they move within a switching layer of the memristive element (106) and thereby change the conductance of the memristive element (106).

A memristive element (106) is non-volatile because the memristive element (106) maintains its conductance. In this manner, the memristive element (106) are "memory resistors" in that they "remember" the last conductance that they had. Put another way, if charge flows in one direction through a memristive element (106), the conductance of that component of the circuit will increase. If charge flows in the opposite direction in the memristive element (106), the conductance win decrease. If the flow of charge is stopped by turning off the applied voltage, the memristive element (106) will "remember" the last conductance that it had, and when the flow of charge starts again the conductance of the memristive element (106) will be what it was when it was last active.

Memristive elements (106) in a memristor array (100) take many forms. One example is a metal-insulator-metal structure where the memristive elements (106) include a first conductive electrode a second conductive electrode and a switching element placed between the conductive electrodes. The first and second conductive electrodes may be formed of an electrically conductive material such as AlCu, AlCuSi, TaAl, TiN, HfN, AlN, Pt, Cu, and WSiN. In some examples the first and second electrode are formed of the same material, and in other examples the second electrode is formed of a different material than the first electrode.

The switching element may be formed of a switching oxide, such as a metallic oxide. Specific examples of switching oxide materials may include magnesium oxide, titanium oxide, zirconium oxide, hafnium oxide, vanadium oxide, niobium oxide, tantalum oxide, chromium oxide, molybdenum oxide, tungsten oxide, manganese oxide, iron oxide, cobalt oxide, copper oxide, zinc oxide, aluminum oxide, gallium oxide, silicon oxide, germanium oxide, tin dioxide, bismuth oxide, nickel oxide, yttrium oxide, gadolinium oxide, and rhenium oxide, among other oxides. In addition to the binary oxides presented above, the switching oxides may be ternary and complex oxides such as silicon oxynitride. The oxides presented may be formed using any of a number of different processes such as sputtering from an oxide target, reactive sputtering from a metal target, atomic layer deposition (ALD), oxidizing a deposited metal or alloy layer, etc. The memristive elements (106) may be fabricated through any other reasonably suitable fabrication process, such as, for example, chemical vapor deposition, sputtering, etching, lithography, or other methods of forming memristive elements (106).

The memristive elements (106) may be built at the micro- or nano-scale and used as a component in a wide variety of electronic circuits, such as, bases for memories and logic circuits. When used as a logic circuit, as described herein, the memristive elements (106) may be employed to represent bits in a field programmable gate array, as the basis for a wired-logic programmable logic array, or as a dot product engine. The memristive elements (106) disclosed herein may also find use in a wide variety of other applications.

The state of the memristive elements (106) may be changed in response to various programming conditions and the memristive element (106) is able to exhibit a memory of past electrical conditions. For instance, the memristive element (106) may be programmed to have one of a plurality of distinct states. Particularly, the conductance level of the switching element may be changed through application of an electrical field, e.g., through application of a current or voltage, in which the current or voltage may cause mobile dopants in the switching element to move and/or change the status of conducting channel(s) in the switching element, which may alter the resulting electrical operation of the memristive element (106). That is, for instance, the distinct conductance levels of the switching element, and thus the state of the memristive element (106), may correspond to different programming current levels or voltage amplitudes applied to the switching element.

By way of example, the switching element may be programmed to have a higher conductance level through application of an earlier current or voltage level. After removal of the current or voltage, the locations and characteristics of the dopants or conducting channels are to remain stable until the application of another programming electrical field. That is, the switching element remains at the programmed conductance level following removal of the current or voltage. While specific reference is made to bipolar memristive elements (106), other resistive memory elements may be used also. Other examples of resistive memory elements include unipolar memristive elements, resistive random-access memory (RRAM) elements, phase-change random-access memory (PCRAM), and magnetoresistive random-access memory (MRAM).

The device also includes a number of offset elements (104). Each offset element is coupled to a row of memristive elements (106). The offset elements (104) have conductance values equal to the offsets used in converting the original weight matrix to the offset weight matrix. For example, in some MAC operations, negative weight values are used to perform destructive interference. Both positive and negative weight values cannot be represented by a single memristive element (106) which is limited to a positive conductance. Accordingly, the original weight values, w, which in some cases are negative, are offset by some fixed positive amount, a, such that they can be represented by a positive conductance of a memristive element (106). Accordingly, each memristive element (106) is equivalent to an offset weight value, the offset weight value equaling w+a, and each offset element (104) has a conductance value equivalent to the offset amount, a.

In other words, the summation of a conductance value of an original (non-offset) memristive element and the conductance value of an offset element (104) represents an offset weight value in an offset matrix, an offset matrix being a matrix with shifted values from an original matrix. An offset matrix weight value is represented by the conductance of a memristive element (106). The offset elements (104) have a conductance value equal to that used to shift the weight values of the original matrix such that any negative weight values in the original matrix are made positive weight values in the offset matrix.

The memristive elements (106) can be used in matrix multiplication. For example, an input vector signal, specifically values of $X_{in1}$, $X_{in2}$, and $X_{in3}$ are passed along to corresponding row lines (108) of the memristive array (100). It should be noted that the input vector may have both positive vector values and negative vector values. The input signal may be in a form (i.e., a sequence of voltage samples) that is representative of a signal, such as an audio signal, a video signal, or other analog or digital signal, that is to be filtered, transformed, convoluted, or otherwise processed by a matrix of values, which matrix of values are represented by the conductances of the number of memristive elements (106).

The memristive elements (106) within the memristive array (100) may be set to any number of conductance levels. For example, some memristive elements (106) may be set to a conductance level of approximately 1 millisiemens (mS) while other memristive elements (106) may be set to conductance levels of approximately 1 microsiemen (μS). Distinct conductance levels may be used to represent, in addition to the offset values, distinct coefficients in an offset matrix.

Returning to the matrix multiplication, each voltage is applied to a row and that voltage is multiplied by the conductance value of the offset weight memristive elements (106) of that row and also is multiplied by the conductance value of the corresponding offset element (104). The original matrix, w, from which the offset matrix, w+a, is generated can have both positive weight values and negative weight values. After being shifted, all the weight values in the offset matrix are positive, such that they can be represented by positive conductances of the memristive elements (106).

An accumulation element (110) that is coupled to a column line (112) of a column of memristive elements (106) collects a current output from the column. Specifically, the accumulation element (100) collects an intermediate output from the individual column lines (112) and subtracts from the intermediate outputs an output (114) of the column of offset elements (104).

A specific example of performing a MAC operation using offset elements (104) is now given. As described above, individual vector values of an input vector are passed to row lines (108) within the memristive array (100). As an input vector value passes to a particular memristive element (106) it is multiplied with the conductance of the particular memristive element (106) of that row line (108). An intermediate output is then collected for each column (112) via the corresponding accumulation element (110). The intermediate output represents a dot product of the input vector, x, and the offset weight vector, w+a, the offset weight vector being a set of weight values from an original matrix, w, that have been offset by the offset values, a. Accordingly, an intermediate output from a particular column (112) can be represented by the following equation:

$$I_{i,offset} = \Sigma x_n \cdot (w_n + a) \quad \text{Equation (1)}.$$

In Equation (1), $I_{i,offset}$ represents an intermediate output for a column (112), $x_n$ represents an input vector sample, $w_n$ represents a weight value of the original matrix and a represents an offset. Accordingly, $w_n+a$ represents an offset weight value. Evaluating Equation (1) leads to the following relationship.

$$I_{i,offset} = \Sigma x_n \cdot w_n + \Sigma x_n \cdot a \quad \text{Equation (2)}.$$

As can be seen, Equation (2) breaks down into the dot product of the input vector X and the original weight vector, w, plus the dot product of the input vector X and the offset vector, a. The offset vector being a vector made up of the individual offset values. The inclusion of the dot product of the input vector and the offset vector may distort the MAC operation. Accordingly, to remove the dot product of the input vector and the offset vector, the accumulation element (110) subtracts the output (114) of the offset column, represented as $\Sigma x_n \cdot a$, from each individual intermediate output, $I_{i,offset}$, to produce $\Sigma x_n \cdot w_n$. The removal of the offset output is illustrated below in Equation 3.

$$I_i = \Sigma x_n \cdot w_n + \Sigma x_n \cdot a - \Sigma x_n \cdot a \quad \text{Equation (3)}.$$

Evaluation of Equation (3) leads to Equation (4) below.

$$I_i = \Sigma x_n \cdot w_n \quad \text{Equation (4)}.$$

Thus as can be seen, the offset elements (104), having a conductance value that maps to the offset value, a, in the equations above, corresponds to the movement of the weight values, w, of the original matrix to the positive domain, but then the output (114) of the offset elements (104) is later removed. Accordingly, the column output, i.e., Equation (4), represents a dot product of the input vector with the original matrix weight values. In other words, the device allows for generating a dot product of an input vector and a matrix of values by first shifting the coefficient values into the positive domain, and then subtracting the shifted amount.

Figure 5:
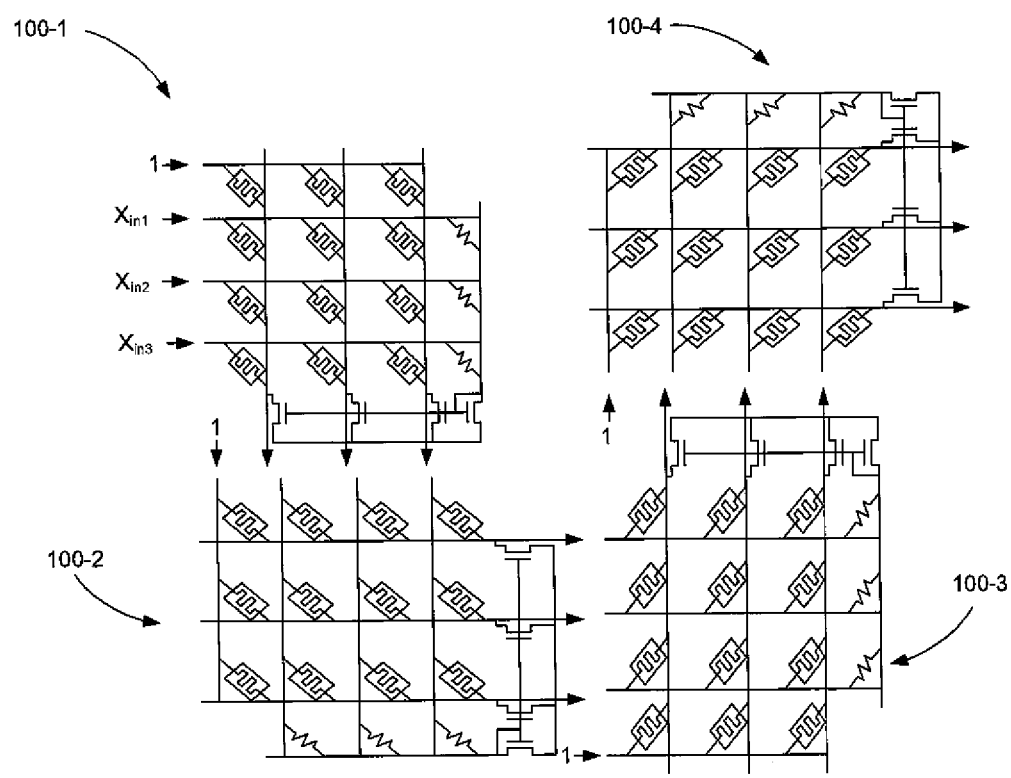
FIG. 5 is a circuit diagram of multiple memristive arrays with offset elements for performing a serial cascade of MAC operations, according to one example of the principles described herein.

Each of the individual column outputs can then be passed onto different circuitry components to carry out different processing operations on those outputs. For example, as depicted in FIG. 5, the outputs may be passed to another array as part of a neural network. To ensure that all weight values of the original matrix are equally shifted, the conductance values of the offset elements (104) may be the same.

Using such an offset element (104) within a matrix is useful in that it allows for a single array (100) to be used to perform MAC operations on matrices initially including both positive weight values and negative weight values. Doing so with a single array (100) reduces the footprint of the array (100) used for such operations as well as reduces the complexity of the device as the use of circuitry to compute partial sums from a positive array and a negative array is alleviated.

Figure 2:
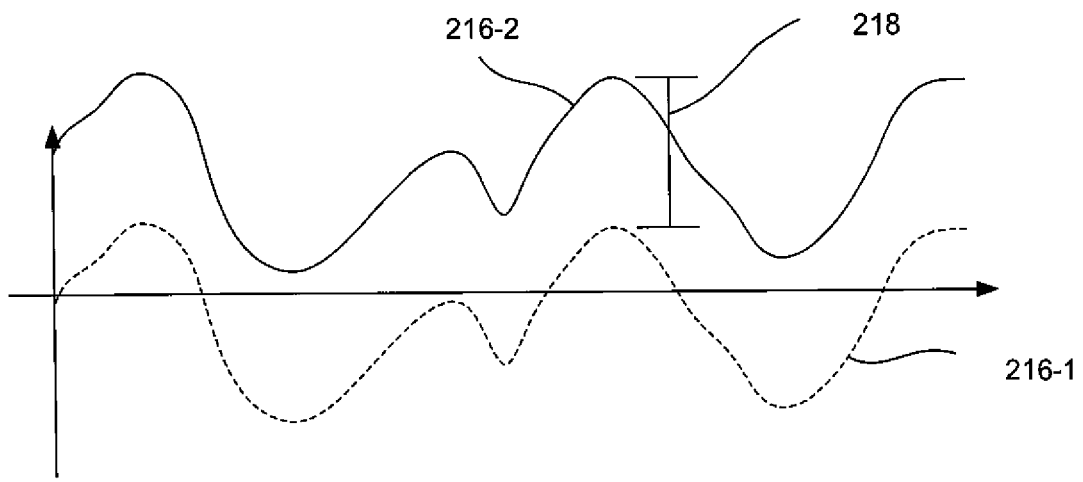
FIG. 2 is a diagram of offset matrix weight values, according to one example of the principles described herein.

FIG. 2 is a diagram of offset matrix weight values (216-2), according to one example of the principles described herein. As, described above, the weight values of the original matrix are shifted by a positive value such that they are no longer negative and can accordingly be represented by memristive elements (FIG. 1, 106) which have positive conductances. For example, as can be seen in FIG. 2, in many instances a matrix used in a MAC operation includes many weight values (216-1), some of which can be negative. Using the equations above, the original weight values (216-1) may be designated as, $w_n$. The offset vector facilitates the representation of the negative weight values by a positive conductance by shifting the original weight values (216-1), by an amount indicated by the arrow (218) such that weight values (216-2) in an offset matrix are all positive. The offset weight values (216-2) may be designated as $w_n+a$. As indicated in FIG. 2, all weight values, as represented by the line (216-1) are equally offset by the same amount to ensure that the results of a MAC operation are not distorted due to relative changes in values of the weight values between the original matrix and the offset matrix.

Figure 3:
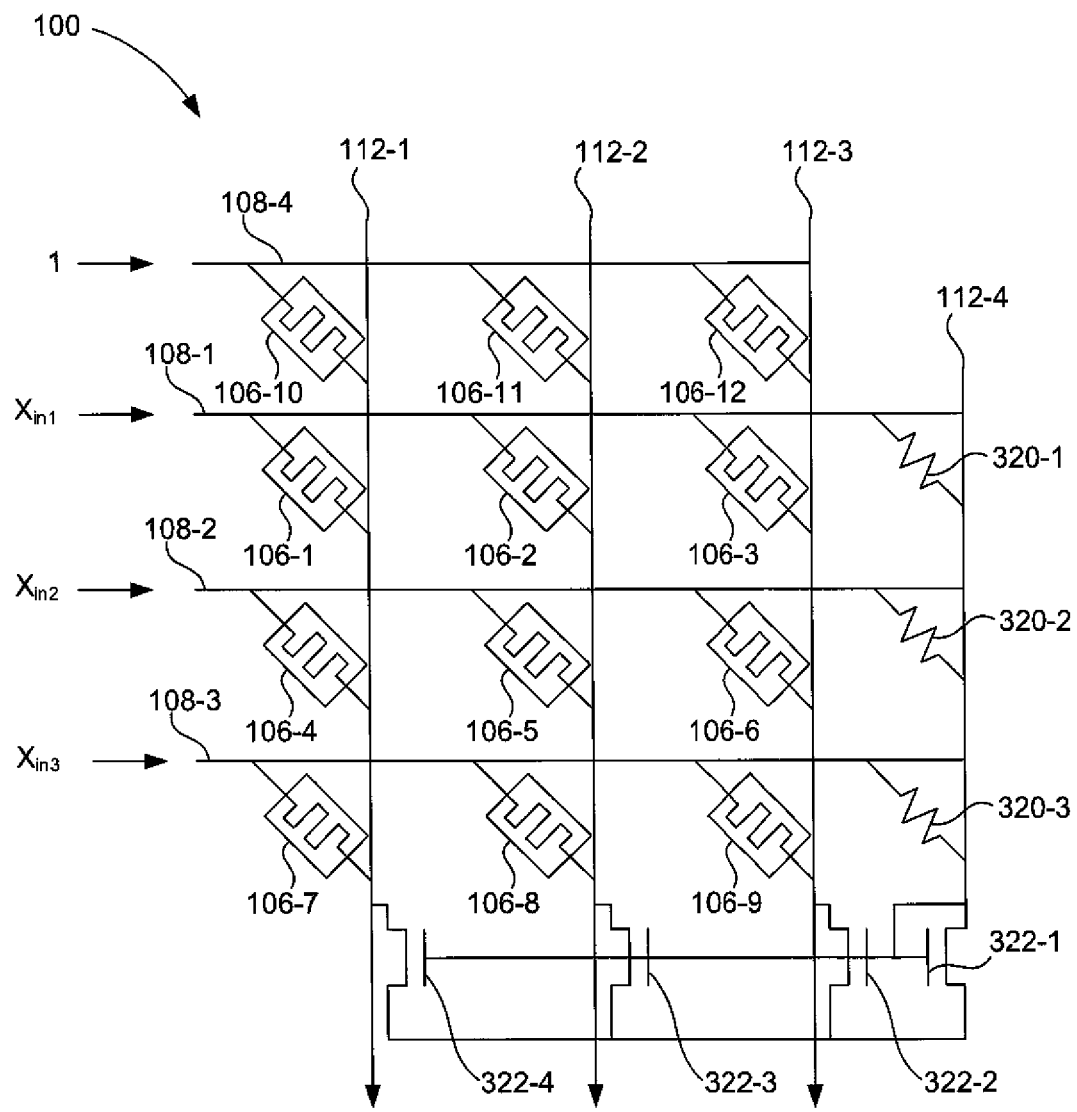
FIG. 3 is a circuit diagram of a memristive array with offset elements for performing a MAC operation, according to one example of the principles described herein.

FIG. 3 is a circuit diagram of a memristive memory array (100) with offset elements (FIG. 1, 104) for performing a MAC operation, according to one example of the principles described herein. As described above, the memristive crossbar array (100) may include a number of electrically conductive row lines (108) and a number of electrically conducting column lines (112). Even though four row lines (108) and three column lines (112) are depicted in FIG. 3, any number of row lines (108) and any number of column lines (112) may be present in the memristive crossbar array (100). The row lines (108) and the column lines (112) intersect at junctions. A number of memristive elements (106) are located at the junctions and are electrically coupled to the row lines (108) and the column lines (112).

Via the row lines (108), input voltages are passed to the rows of memristive elements (106). The voltages may represent input values of an input vector. As described above, the input vector is representative of a signal, such as an audio or video signal to be filtered, transformed, convoluted or otherwise processed via a matrix multiplication operation. The input voltages interact with the memristive elements (106) and the resulting current is collected at the end of each column line (112). The system also includes an offset column. The offset column may include a number of offset elements (FIG. 1, 104) arranged in a column. In one example, the offset column is a column of resistors (320-1, 320-2, 320-3) having fixed resistance values. The resistance value of such resistors (320) may be the same as one another and of a sufficiently large value such that no offset weight values (FIG. 2, 216-2) in an offset matrix are negative.

A number of memristive column lines (112-1, 112-2, 112-3) are used to collect an intermediate output of a corresponding column of memristive elements (106). For example, the input voltages interact with the memristive elements (106) and the resulting current is collected at the end of each column line (112). Such an intermediate output defines a dot product of the input vector, X, and an offset weight vector, w+a. In other words, the dot product of the input vector and offset weight vector can be mathematically represented as Equation (1) or Equation (2) above.

An offset column line (112-4) is used to collect an offset output of the offset column. Mathematically, the offset output can be represented as a dot product of the offset vector and the input vector, i.e., $\Sigma x_n \cdot a$, where $x_n$ is the input vector value and a is the offset vector value. As can be seen from this representation, the offset output is not dependent upon the weights of the original matrix and may therefore be the same for each row regardless of original matrix weight values.

However, as indicated above, offsetting the original weight values and using offset weight values may skew the output from a column. Accordingly, the system includes a number of accumulation elements (FIG. 1, 110) to subtract the offset output from each intermediate output to generate a column output. As the accumulation elements (FIG. 1, 110) subtract the offset output, the resulting column output defines a dot product of the input vector signal and an original weight vector, i.e., the offset weight vector with the offset amount removed. In some examples, the accumulation elements (FIG. 1, 110) may include output transistors (322-2, 322-3, 322-4) of a multi-output current mirror. Specifically, the input of the current mirror, i.e., a first transistor (322-1) is coupled to the offset column line (112-4) and the outputs of the current mirror, i.e., other transistors (322-2, 322-3, 322-4) are coupled to each memristive column line (112-1, 112-2, 112-3).

In a current mirror, if two matched transistors operating in saturation have the same gate-source voltage (and same bulk-source voltage) they will have the same channel current (to the first order). Accordingly, as each of the transistors (322) has the same gate-source voltage each will have the same current. The input transistor (322-1) being diode-connected finds the right gate-source voltage for the channel current flowing through it and since its gate is connected to all the output transistor (322-2, 322-3, 322-4) gates and its source is connected to all of the output transistors (322-2, 322-3, 322-4) sources, all of the output transistors (322-2, 322-3, 322-4) have the same gate-source voltage and duplicate the input transistors (322-1) current. When implemented as described, the accumulation elements (FIG. 1, 110) which include the output transistors (322-2, 322-3, 322-4) of the current mirror subtract the output of the offset column line (112-4) from their respective intermediate outputs which results in individual column outputs as identified in Equation (4). As such, a dot product is carried out on a matrix that may have negative weight values and an input vector as if the matrix did not have negative weight values. This is done by first shifting the original matrix weight values to a non-negative value, performing the MAC operation, and then subtracting the offset from the result.

In some examples, the array (100) includes a threshold row line (108-4). Along this threshold row line (108-4), a unity value, 1, may be applied and memristors (106-10, 106-11, 106-12) in this row provide an additional offset to the dot product, θ, included in each column. The output of an individual column (112) may be represented by Equation 5 presented below.

$$I_i = \theta + \Sigma x_n \cdot w_n \quad \text{Equation (5).}$$

Figure 4:
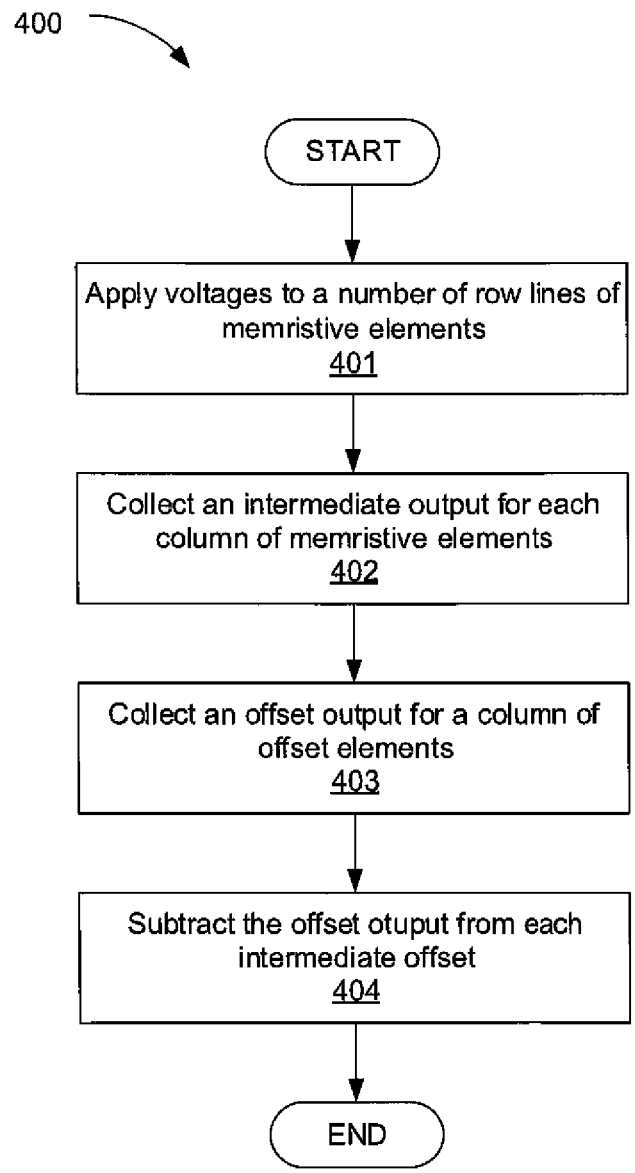
FIG. 4 is a diagram of a method for performing a MAC operation, according to one example of the principles described herein.

FIG. 4 is a diagram of a method (400) for performing a MAC operation, according to one example of the principles described herein. According to the method, voltages (block 401) are applied to a number of row lines (FIG. 1, 108) of memristive elements (FIG. 1, 106). A row line (FIG. 1, 108) also includes an offset element (FIG. 1, 104). As described above, the voltages represent sample values of an input vector signal that is to be processed. The voltages may be either positive value or negative value voltages. The application of the voltages to the offset weight memristive elements (FIG. 1, 106) functions as a multiplication operation of the input signal.

Next, an intermediate output is collected (block 402) for each column of memristive elements (FIG. 1, 106). The intermediate output may be a current which represents the multiplication of an input voltage with the conductance of the memristive element (FIG. 1, 106) of the corresponding row line (FIG. 1, 108). In other words, the intermediate output defines a dot product of the input vector and an offset weight vector, which offset weight vector includes values defined by a summation of the original weight value, w, and an offset value, a.

To replicate an actual dot product of an input vector and an original (and not offset) matrix, the effect of the offset value is now removed from the array (FIG. 1,100). More specifically, for a column of offset elements (FIG. 1, 104), an offset output (FIG. 1, 114) that defines a dot product of the input vector and the offset vector is collected (block 403) and subtracted (block 404) from each intermediate output. Doing so results in a column output that defines a dot product of the input vector and a weight vector. Such a method (400) allows for calculation of a dot product of a matrix that may have negative values with an input vector while not requiring additional complex circuitry or arrays (FIG. 1, 100) in so doing. Rather, the weight values, w, which may be negative, are first offset via the offset values, a, a positive offset, and the result w+a, an array of positive values, is stored in the memristive elements (106). A MAC operation is then carried out, and the input-dependent offset subtracted such that the results are not skewed, or effected by the offset element values.

FIG. 5 is a circuit diagram of multiple memristive memory arrays (100) with offset elements (FIG. 1, 104) for performing a MAC operation, according to one example of the principles described herein. In some examples, a single memristive memory array (100) may be one of multiple serially-coupled crossbar arrays (100-1, 100-2, 100-3, 100-4). In this example, the output of different columns may be used as input into another array. More specifically, the output of a first array (100-1) may be used as an input into a second array (100-2) where a second MAC operation is performed and the output of the second array (100-2) passed as an input to the third array (100-3). An example of such a series of arrays (100) is a neural network. Neural networks are computing networks that attempts to mimic a biological neural network such as a brain. A neural network may have adaptive weights i.e., weights that adjust based on a learning operation. Neural networks are also capable of approximating non-linear functions of an input.

Figure 6:
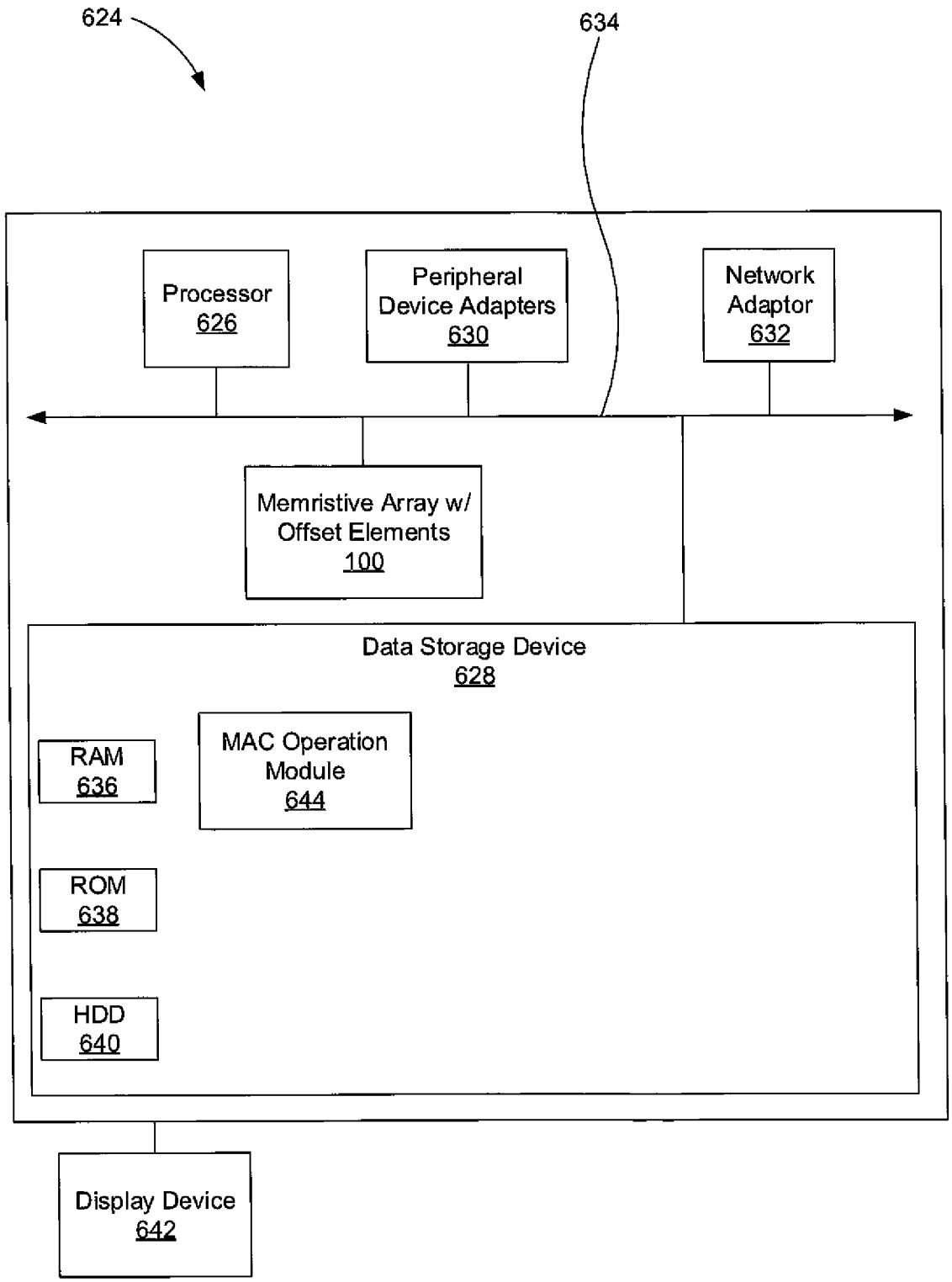
FIG. 6 is a diagram of a computing system that uses a memristive array with offset elements, according to one example of the principles described herein.

FIG. 6 is a diagram of a computing device (624) that uses a memristive array (100) with an offset elements (FIG. 1,104), according to one example of the principles described herein. The computing device (624) may be implemented in an electronic device. Examples of electronic devices include servers, desktop computers, laptop computers, personal digital assistants (PDAs), mobile devices, smartphones, gaming systems, and tablets, among other electronic devices.

The computing device (624) may be utilized in any data processing scenario including, stand-alone hardware, mobile applications, through a computing network, or combinations thereof. Further, the computing device (624) may be used in a computing network, a public cloud network, a private cloud network, a hybrid cloud network, other forms of networks, or combinations thereof. In one example, the methods provided by the computing device (624) are provided as a service over a network by, for example, a third party.

To achieve its desired functionality, the computing device (624) includes various hardware components. Among these hardware components may be a number of processors (626), a number of data storage devices (628), a number of peripheral device adapters (630), and a number of network adapters (632). These hardware components may be interconnected through the use of a number of busses and/or network connections. In one example, the processor (626), data storage device (628), peripheral device adapters (630), and a network adapter (632) may be communicatively coupled via a bus (634).

The processor (626) may include the hardware architecture to retrieve executable code from the data storage device (628) and execute the executable code. The executable code may, when executed by the processor (626), cause the processor (626) to implement at least the functionality of shifting weight values for a MAC operation. The functionality of the computing device (624) is in accordance to the methods of the present specification described herein. In the course of executing code, the processor (626) may receive input from and provide output to a number of the remaining hardware units.

The data storage device (628) may store data such as executable program code that is executed by the processor (626) or other processing device. As will be discussed, the data storage device (628) may specifically store computer code representing a number of applications that the processor (626) executes to implement at least the functionality described herein.

The data storage device (628) may include various types of memory modules, including volatile and nonvolatile memory. For example, the data storage device (628) of the present example includes Random Access Memory (RAM) (636), Read Only Memory (ROM) (638), and Hard Disk Drive (HDD) memory (640). Many other types of memory may also be utilized, and the present specification contemplates the use of many varying type(s) of memory in the data storage device (628) as may suit a particular application of the principles described herein. In certain examples, different types of memory in the data storage device (628) may be used for different data storage needs. For example, in certain examples the processor (626) may boot from Read Only Memory (ROM) (638), maintain nonvolatile storage in the Hard Disk Drive (HDD) memory (640), and execute program code stored in Random Access Memory (RAM) (636).

The data storage device (628) may include a computer readable medium, a computer readable storage medium, or a non-transitory computer readable medium, among others. For example, the data storage device (628) may be, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (630, 632) in the computing device (624) enable the processor (626) to interface with various other hardware elements, external and internal to the computing device (624). For example, the peripheral device adapters (630) may provide an interface to input/output devices, such as, for example, display device (642), a mouse, or a keyboard. The peripheral device adapters (630) may also provide access to other external devices such as an external storage device, a number of network devices such as, for example, servers, switches, and routers, client devices, other types of computing devices, and combinations thereof.

The display device (642) may be provided to allow a user of the computing device (624) to interact with and implement the functionality of the computing device (624). The peripheral device adapters (630) may also create an interface between the processor (626) and the display device (642), a printer, or other media output devices. The network adapter (632) may provide an interface to other computing devices within, for example, a network, thereby enabling the transmission of data between the computing device (624) and other devices located within the network.

The computing device (624) may, when executed by the processor (626), display the number of graphical user interfaces (GUIs) on the display device (642) associated with the executable program code representing the number of applications stored on the data storage device (628). The GUIs may display, for example, interactive screenshots that allow a user to interact with the computing device (624) to input values in association with the memristive array (100) as will be described in more detail below. Additionally, via making a number of interactive gestures on the GUIs of the display device (866), a user may obtain a dot product value based on the input data. Examples of display devices (642) include a computer screen, a laptop screen, a mobile device screen, a personal digital assistant (PDA) screen, and a tablet screen, among other display devices (642).

The computing device (624) may further include a memristive array (100) with offset elements (FIG. 1, 104). The array (100) includes an array of memristive elements (FIG. 1, 106) that are used in carrying out MAC operations. The array (100) also includes a number of offset elements (FIG. 1, 104) that ensure that offset matrix values are not negative. The offset value is then subtracted form a column multiplication thereby resulting in a MAC operation that is not effected by negative weights.

The computing device (624) further includes a number of modules used in the implementation of the systems and methods described herein. The various modules within the computing device (624) include executable program code that may be executed separately. In this example, the various modules may be stored as separate computer program products. In another example, the various modules within the computing device (624) may be combined within a number of computer program products; each computer program product including a number of the modules.

The computing device (624) may include a MAC operation module (644) to, when executed by the processor (626), assist in the functionality of the memristive array (100). The MAC operation module (644), for example, is used to determine the input voltages applied to the row lines of the array.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (626) of the computing system or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

Using offset elements to shift weight values of an original matrix to the positive domain allows a single array of memristive elements to represent an original matrix that has both negative weight values and positive weight values. In other words, where before multiple fully-duplicated arrays were used to represent positive and negative weight values in a matrix; using an offset, each weight value in a matrix can be shifted such that in an offset matrix there are no negative weights. Accordingly, each weight value in the offset matrix can be represented by a positive conductance of a memristive element. However, it is contemplated that the devices disclosed herein may provide useful in addressing other matters and deficiencies in a number of technical areas. Therefore the systems and methods disclosed herein should not be construed as addressing any of the particular matters.

The preceding description has been presented to illustrate and describe examples of the principles described. This description is not intended to be exhaustive or to limit these principles to any precise form disclosed. Many modifications and variations are possible in light of the above teaching.

What is claimed is:

1. An apparatus, comprising:
   a plurality of memristive elements, wherein a respective memristive element has a conductance value that indicates an input value;
   a column of offset elements, wherein a respective offset element is coupled to a row of memristive elements of the plurality of memristive elements and has a conductance value that indicates an offset value for adding to the input value; and
   a plurality of accumulation elements, wherein a respective accumulation element is coupled to a column of memristive elements of the plurality of memristive elements and the column of offset elements;
   wherein the accumulation element is configured to:
   collect an intermediate output from the column of memristive elements; and
   subtract from the intermediate output an output from the column of offset elements.

2. The apparatus of claim 1, wherein an offset element is a resistor with a fixed conductance value.

3. The apparatus of claim 1, wherein conductance values of the plurality of offset elements are the same and indicate the offset value.

4. The apparatus of claim 1, wherein the offset value shifts input values indicated by the memristive elements such that any negative values in the input values are made positive.

5. The apparatus of claim 1, wherein the plurality of memristive elements are organized in a crossbar array with one or more rows and one or more columns.

6. The apparatus of claim 1, wherein conductance values of the memristive elements indicate an original matrix having both positive values and negative values.

7. The apparatus of claim 1, wherein an accumulation element of the plurality of accumulation elements comprises an output of a multi-output current mirror with an input of the current mirror coupled to the column of offset elements.

8. The apparatus of claim 1, further comprising a threshold row line configured to add a unity value to output from the column of memristive elements.

9. The apparatus of claim 1, wherein the apparatus is a crossbar array of multiple serially-coupled crossbar arrays.

10. A method for computing a dot product comprising:
    applying voltages to a plurality of row lines in a crossbar array,
    wherein a respective voltage defines an input value of an input vector, and
    wherein a respective row line comprises:
    a plurality of memristive elements; and an offset element, which has a conductance value that indicates an offset value for adding to the input value;

collecting, for respective column of memristive elements in the crossbar array, an intermediate output that indicates a dot product of the input vector and an offset weight vector of an offset weight matrix wherein the offset weight vector includes a set of weight values from an original matrix that have been offset by the offset value;

collecting, for a column of offset elements, an offset output that indicates a dot product of the input vector and an offset vector of the offset value; and subtracting the offset output from a respective intermediate output to generate a column output that indicates a dot product of the input vector and a weight vector.

11. The method of claim 10, wherein the offset vector facilitates the representation of negative weight values by a positive conductance of a memristive element.

12. The method of claim 10, wherein the offset value offsets the weight values of the original matrix such that no weight values in the offset weight matrix are negative.

13. A crossbar array comprising:

a plurality of row lines to pass voltages indicating input values of an input vector to rows of memristive elements;

a plurality of column lines intersecting the row lines to form a number of junctions;

a plurality of memristive elements coupled between the row lines and the column lines at the junctions, wherein a respective memristive element has a conductance value that indicates one of the input values;

an offset element column, wherein a respective offset element is coupled to a row of memristive elements and has a conductance value that indicates an offset value for adding to the input value;

an offset column line configured to collect an offset output of the offset element column;

a plurality of memristive column lines, wherein a respective memristive column line is configured to collect an intermediate output of a corresponding column of memristive elements; and a plurality of accumulation elements, wherein a respective accumulation element is coupled to a column of memristive elements and configured to subtract the offset output from a respective intermediate output.

14. The crossbar array of claim 13, wherein the offset value shifts input values indicated by the memristive elements such that any negative values in the input values are made positive.

15. The crossbar array of claim 13, wherein an accumulation element of the plurality of accumulation elements comprises an output of a multi-output current mirror with an input of the current mirror coupled to the offset column line.

16. The crossbar array of claim 13, further comprising a threshold row line configured to add a unity value to outputs from the plurality of memristive column lines.

17. The crossbar array of claim 13, wherein conductance values of the plurality of offset elements are the same and indicate the offset value.

18. The crossbar array of claim 13, wherein the crossbar array is one of multiple serially-coupled crossbar arrays.

19. The crossbar array of claim 13, wherein an offset element is a resistor with a fixed conductance value.

20. The crossbar array of claim 13, wherein conductance values of the memristive elements indicate an original matrix having both positive values and negative values.

* * * * *